(12) United States Patent
Kuo

(10) Patent No.: US 8,168,894 B2
(45) Date of Patent: May 1, 2012

(54) LIGHT EMITTING DIODE (LED) CIRCUIT BOARD WITH MULTI-DIRECTIONAL ELECTRICAL CONNECTION

(75) Inventor: Hsiao-Wan Kuo, Taichung (TW)

(73) Assignee: Safety Traffic Equipment Co., Ltd., Taichung (TW)

( * ) Notice: Subject to any disclaimer, the term of this patent is extended or adjusted under 35 U.S.C. 154(b) by 488 days.

(21) Appl. No.: 12/504,627

(22) Filed: Jul. 16, 2009

(65) Prior Publication Data

US 2011/0013406 A1    Jan. 20, 2011

(51) Int. Cl.
*H05K 1/00* (2006.01)

(52) U.S. Cl. .................................... 174/260; 361/760
(58) Field of Classification Search .................. 174/260, 174/261; 361/760, 781–783
See application file for complete search history.

*Primary Examiner* — Jeremy Norris
(74) *Attorney, Agent, or Firm* — Egbert Law Offices PLLC

(57) ABSTRACT

The present invention provides a light emitting diode (LED) circuit board with a multi-directional electrical connection. The board includes a board body with a surface and an assembly plane as well as four sides and corresponding corners, and a plurality of positive and negative electric contacts, separately arranged onto the surface of the board body nearby four sides, and also arranged at intervals. The circuit of the LED circuit board is simplified, helping to facilitate multi-directional electrical connection and expansion, and to improve significantly the paving efficiency of the LED circuit board with better practicability and industrial benefits.

8 Claims, 7 Drawing Sheets

LIGHT EMITTING DIODE (LED) CIRCUIT BOARD WITH MULTI-DIRECTIONAL ELECTRICAL CONNECTION

CROSS-REFERENCE TO RELATED U.S. APPLICATIONS

Not applicable.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

BACKGROUND OF THE INVENTION

1. Field of the Invention

The present invention relates generally to a light emitting diode (LED) circuit board, and more particularly to an innovative circuit board with a multi-directional electrical connection.

2. Description of Related Art Including Information Disclosed Under 37 CFR 1.97 and 37 CFR 1.98.

An LED is applied in such a manner that it must be arranged on a circuit board to control the on/off of the light, the glittering mode/state and the electrical connection of LED circuits. Thus, the LED circuit board is available with several structural forms depending on different actual requirements.

Generally, LED units for a typical LED lamp are incorporated onto a single circuit board, which is characterized by its simplified design since LED units are permanently fixed during application.

When a LED circuit board is applied to a marking panel (or ads board), various LED units are arranged according to the patterns, letters and strips on the marking panel. Thus, the LED circuit board is generally designed into a single (or a few) LED unit, namely, integrated into a light emitting module of distributed structure in collaboration with a circuit board. Owing to the fact that various light emitting modules are electrically connected possibly at different directions, it is important to plan and design the electrical connection of said light emitting modules, so the technical challenge faced by the industry is how to develop a novel LED circuit board that enables convenient multi-directional electrical connection.

Thus, to overcome the aforementioned problems of the prior art, it would be an advancement in the art to provide an improved structure that can significantly improve efficacy.

Therefore, the inventor has provided the present invention of practicability after deliberate design and evaluation based on years of experience in the production, development and design of related products.

BRIEF SUMMARY OF THE INVENTION

There is enhanced efficacy of the present invention.

Based upon the unique present invention, the LED circuit board with multi-directional electrical connection allows the board body to be provided with positive and negative electric contacts. It is possible to simplify the circuit of the LED circuit board of the present invention, helping to facilitate multi-directional electrical connection and expansion, and improve significantly the paving efficiency of LED circuit board with better practicability and industrial benefits.

There are improvements brought about by this invention.

Based upon the branching sign, the installers may find it easier to identify if the positive and negative electric contacts at various sides of the board body are power input or output side, and then decide the arrangement direction of the board body.

Based upon the structure of a notched flange preset at two connected sides of the board body of the LED circuit board, it is easy to break off the sides and level the fracture surface.

Although the invention has been explained in relation to its preferred embodiment, it is to be understood that many other possible modifications and variations can be made without departing from the spirit and scope of the invention as hereinafter claimed.

DETAILED DESCRIPTION OF THE INVENTION

Figure 1:
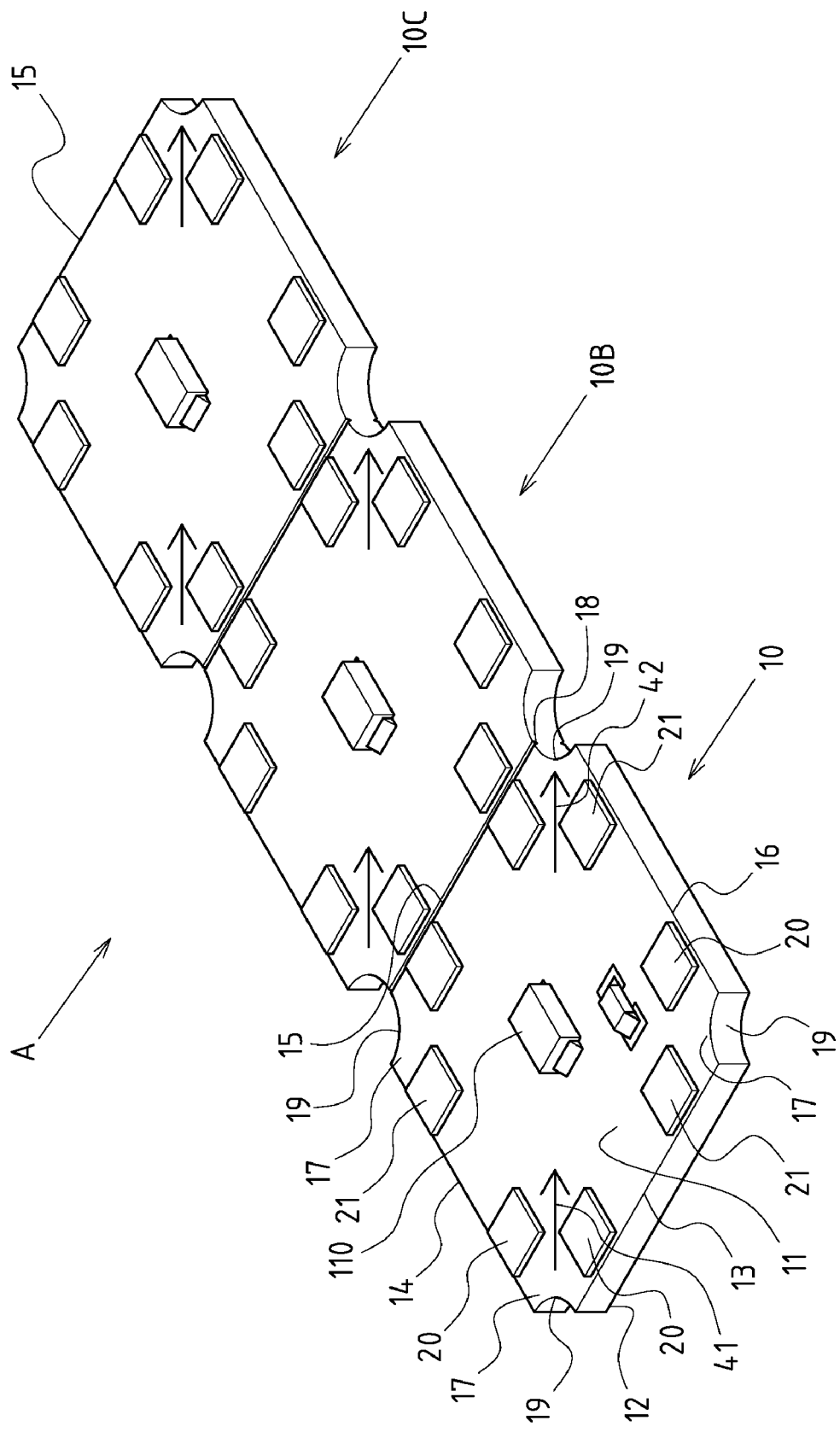
FIG. 1 shows an assembled perspective view of the preferred embodiment of the present invention.
Figure 2:
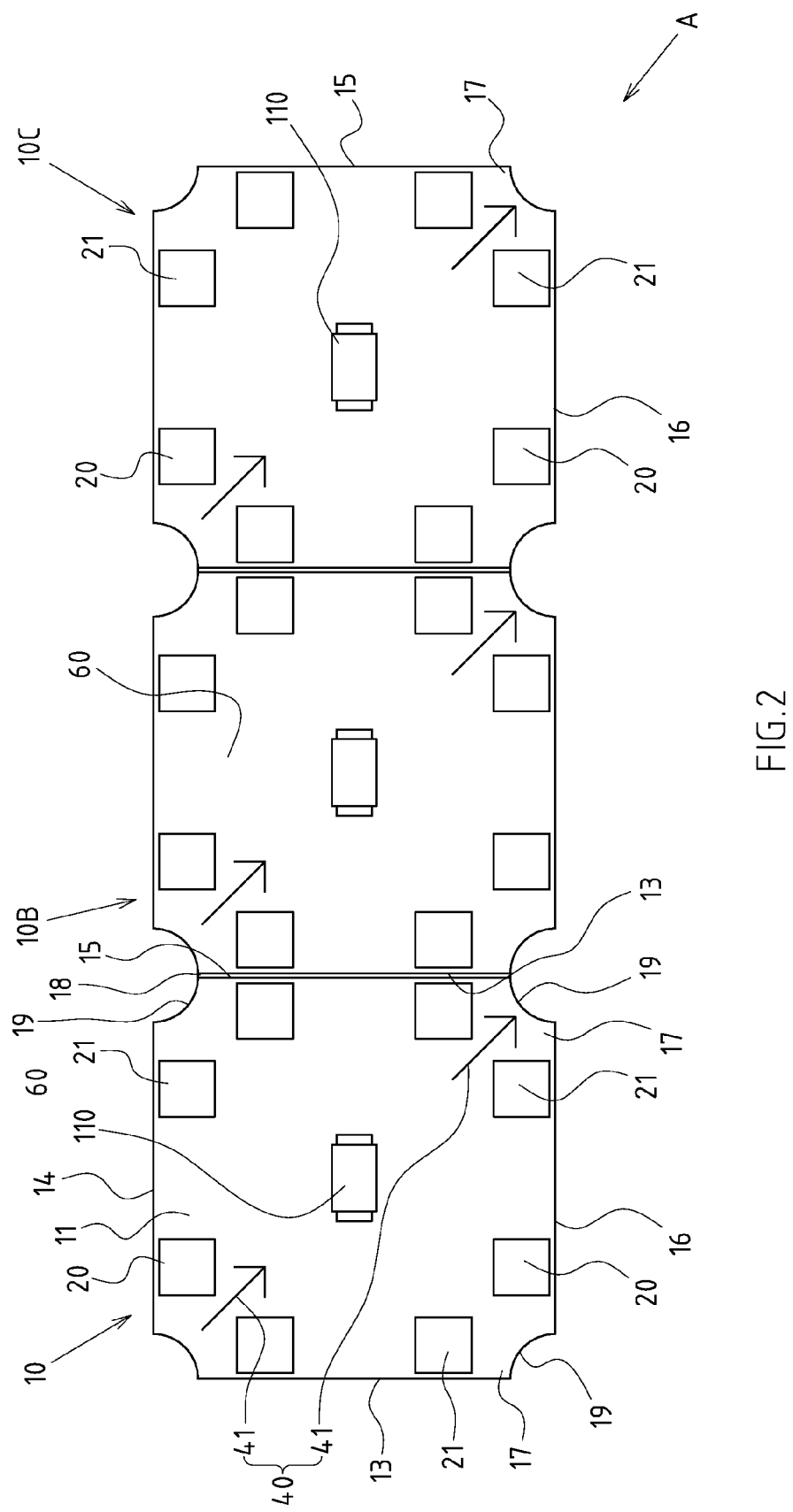
FIG. 2 shows an assembled top plan view of the preferred embodiment of the present invention.
Figure 3:
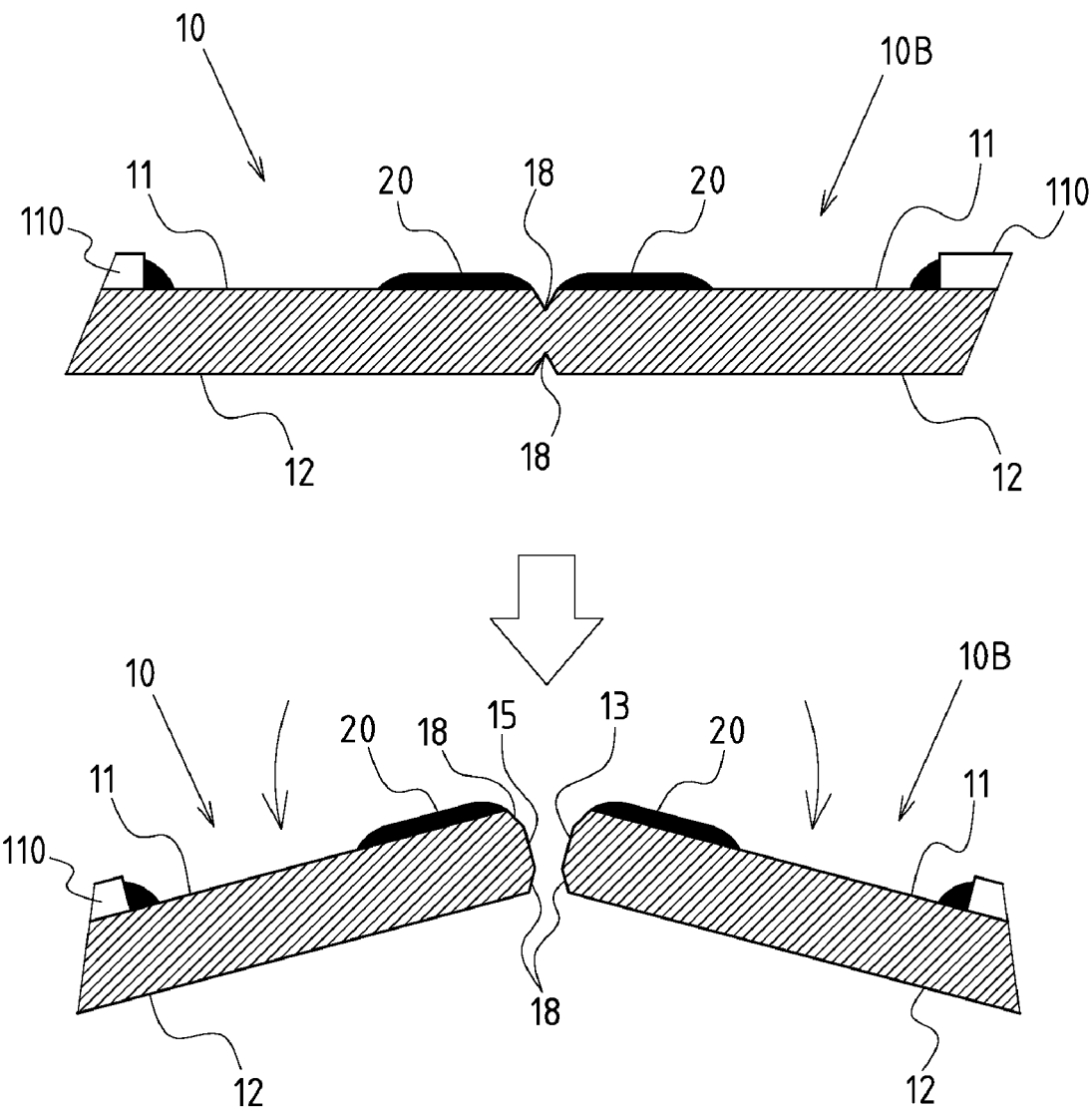
FIG. 3 shows a sectional view of the present invention that the board body can be broken and separated.

FIGS. 1-3 depict preferred embodiments of an LED circuit board of the present invention with multi-directional electrical connection. The embodiments are provided for only explanatory purposes with respect to the patent claims.

The LED circuit board A comprises at least a board body 10, 10B, 10C, which refers to a board of certain thickness defining a surface 11 and an assembly plane 12. The board body 10, 10B, 10C is provided with at least four sides 13, 14, 15, 16 and corners 17 between these sides. The surface 11 is provided with at least an LED unit 110. The LED circuit board of the preferred embodiment is of a modular pattern connected by three board bodies 10, 10B, 10C. A precut slit 18 is preset between the connected sides of the board bodies 10, 10B, 10C, so that the connected side 15, 13 of the board bodies 10, 10B, 10C can be easily broken and separated (shown in FIG. 3).

A plurality of positive and negative electric contacts 20, 21, are separately arranged onto the surface of the board body 10, 10B, 10C nearby four sides 13, 14, 15, 16, whilst the positive and negative electric contacts 20, 21 are arranged at intervals.

At least a branching sign 40, referring to FIG. 2, is arranged onto an extended path between two obliquely opposite corners 17 set on the surface of the board bodies 10, 10B, 10C. With the help of the branching sign 40, it is possible to identify if the positive and negative electric contacts 20, 21 nearby the sides of the board bodies 10, 10B, 10C are located at power input or output sides. The branching sign 40 of the preferred embodiment is composed of a first arrow 41 nearby a corner 17 and the second arrow 42 nearby another corner 17, which are used to mark two sides 13, 14 nearby the first arrow 41 as power input side, and two sides 15, 16 nearby the second arrow 42 as power output side. When the LED circuit board A is assembled, the arrangement direction of board bodies 10, 10B, 10C can be determined by the marking of the branching sign 40, and the board bodies 10, 10B, 10C are electrically connected by the positive and negative electric contacts 20, 21, and also electrically supplied by only connecting the local board body with the power supply.

Referring to FIGS. 1 and 2, a notched flange 19 is preset between two connected sides of the board bodies 10, 10B, 10C of the LED circuit board 10, helping to easily break off them and level the fracture surface.

Figure 4:
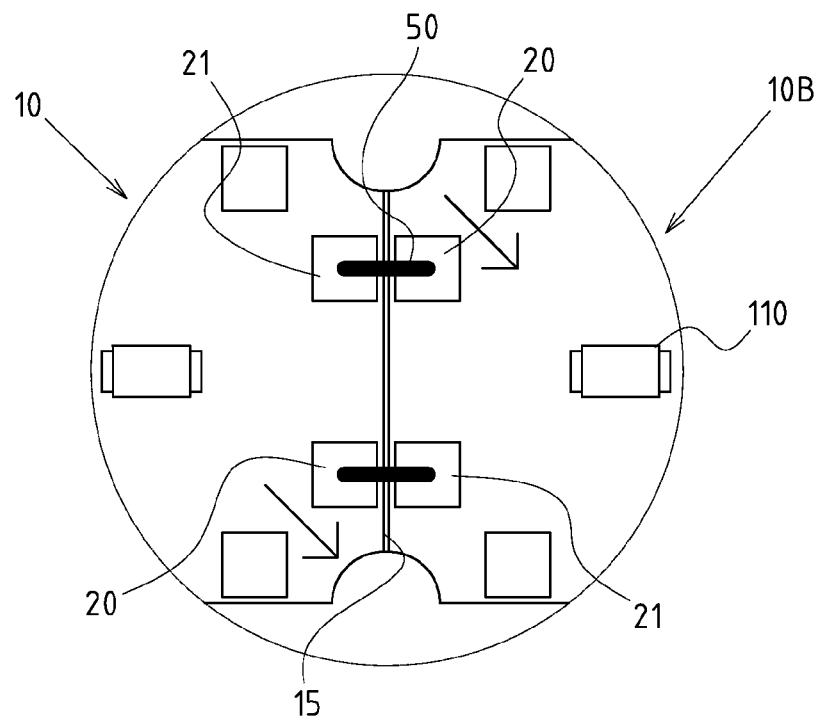
FIG. 4 shows a schematic view of the present invention connecting positive/negative electrodes, positive/negative electric contacts and series positive/negative electric contacts of different board bodies via conductor wire, wherein two board bodies are connected.
Figure 5:
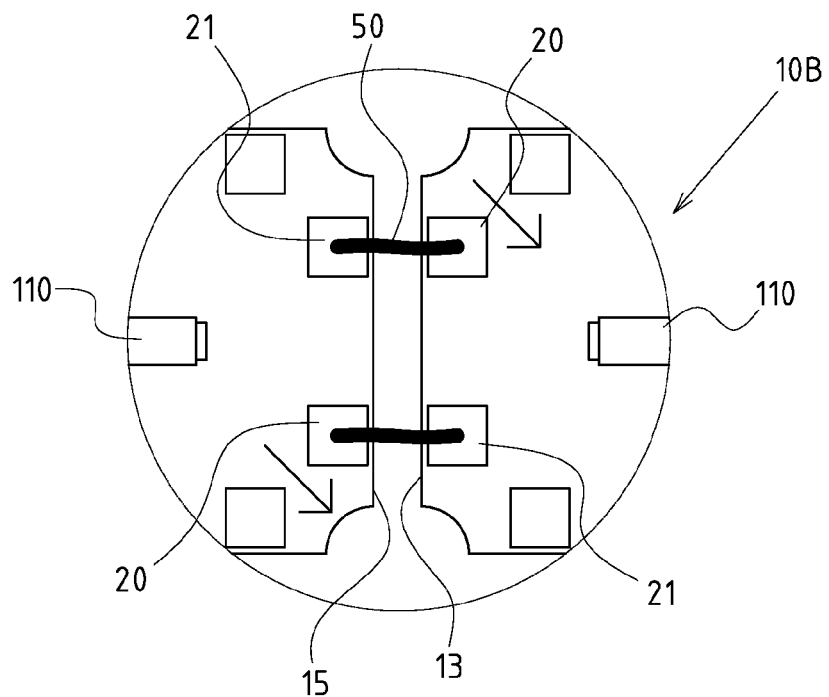
FIG. 5 shows another schematic view of the present invention connecting positive/negative electrodes, positive/negative electric contacts and series positive/negative electric contacts of different board bodies via conductor wire, wherein two board bodies are separated.

Referring to FIGS. 4 and 5, the positive and negative electric contacts 20, 21 of different board bodies 10, 10B, 10C of the LED circuit board 10 can be connected by conductor wire 50 and welded for electric transmission. Moreover, the board bodies 10, 10B, 10C can be mated side by side (shown in FIG. 4) or separated from each other (shown in FIG. 5).

Figure 6:
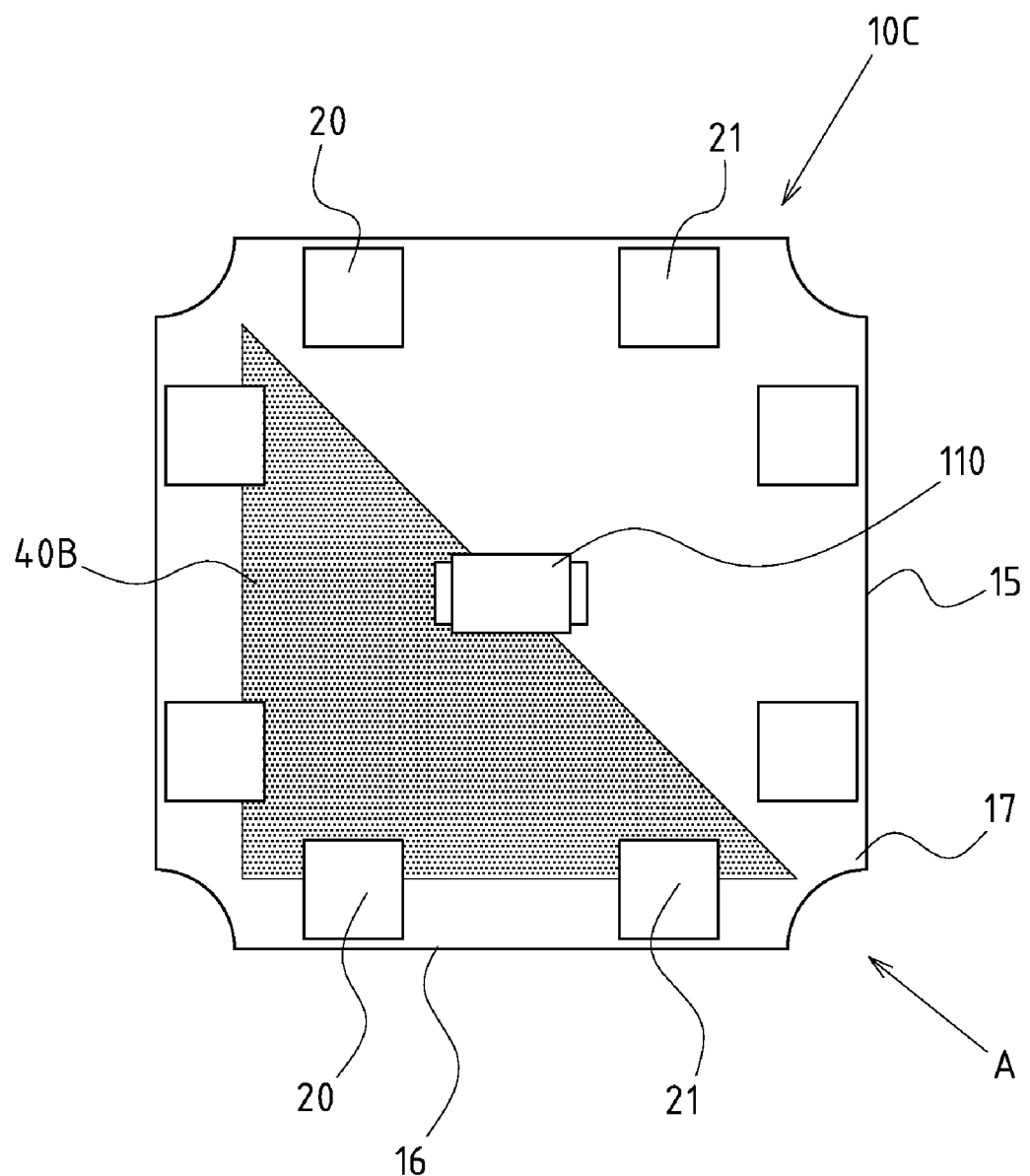
FIG. 6 shows a schematic view of another preferred embodiment of the branching sign of the present invention.

Referring to FIG. 6, another preferred embodiment of the branching sign 40B, wherein the branching sign 40B is a triangular color block, which is distributed to determine the arrangement direction of the board body 10, 10B, 10C.

Figure 7:
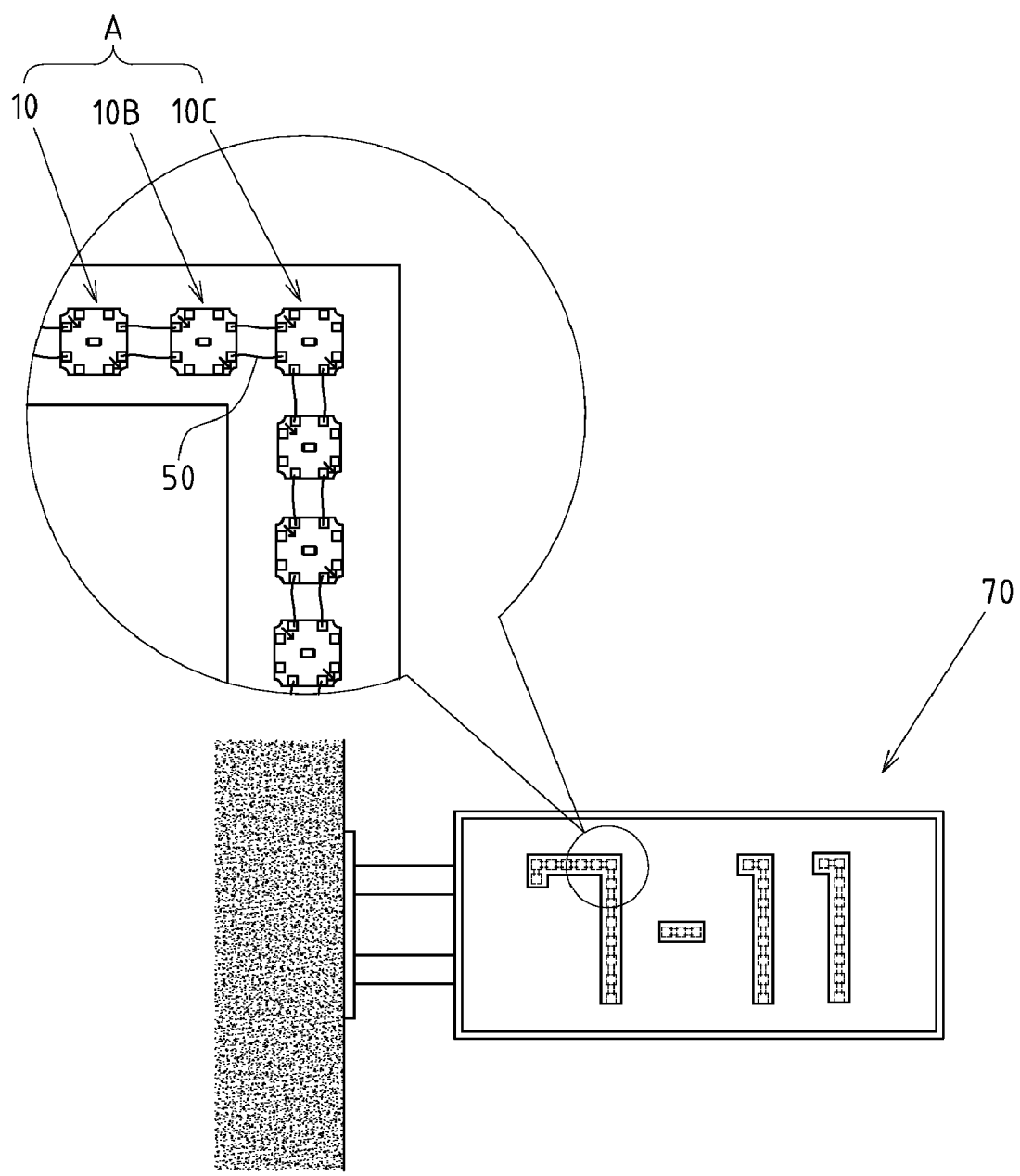
FIG. 7 shows a schematic view of a preferred embodiment of the present invention that the LED circuit board is applied to ads board.

Referring to FIG. 7, based upon above-specified structures, the LED circuit board A of the present invention is attached securely onto the surface of existing ads board 70, and arranged along the letters, patterns and strips of the ads board 70. When the LED circuit board A is highlighted, the ads board 70 can give users a shiny marking.

Figure 8:
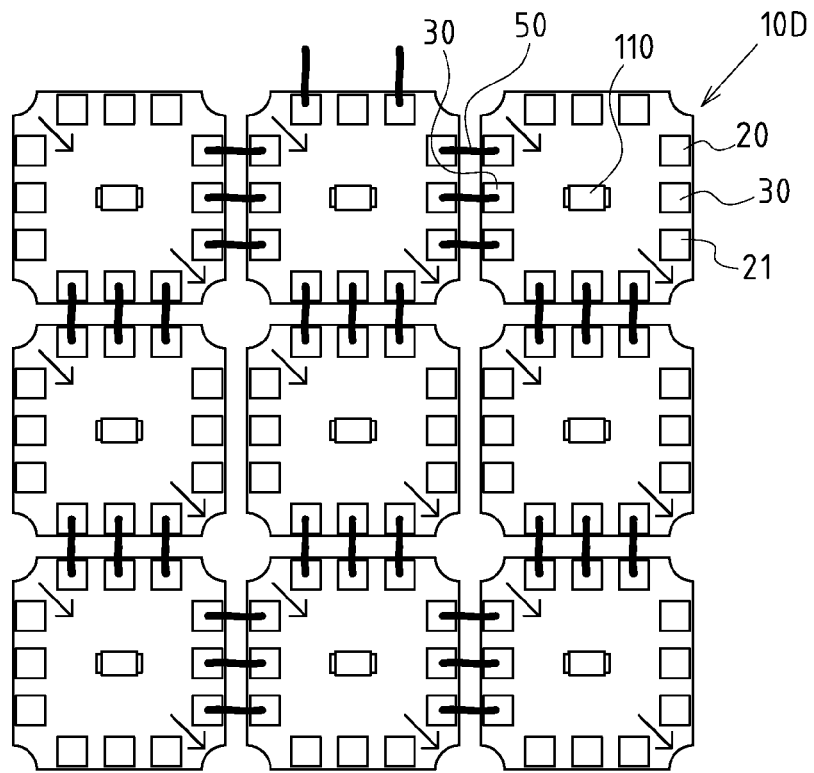
FIG. 8 shows a schematic view of a preferred embodiment of the present invention that the LED circuit board is additionally provided with tandem electric contacts.
Figure 9:
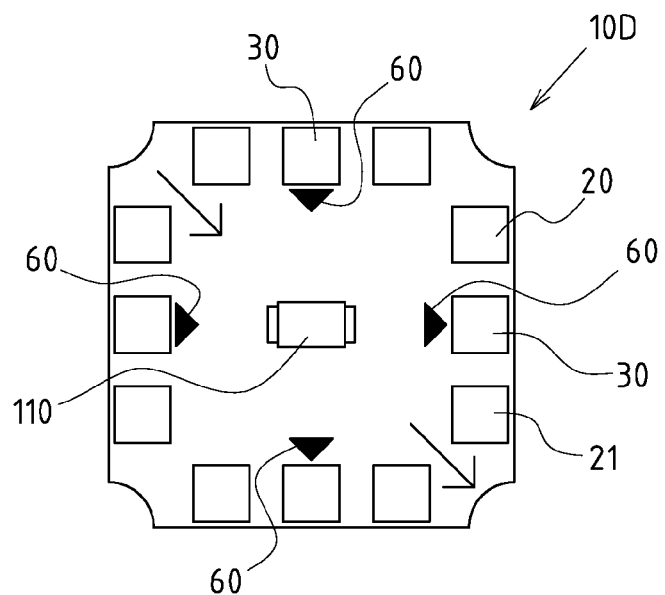
FIG. 9 shows another schematic view of a preferred embodiment of the present invention that current indicator is arranged correspondingly to the tandem electric contacts.

Referring also to FIG. 8, tandem electric contacts 30 are arranged on the surface of the board body 10D adjacent to at least two sides, and also at interval between the positive and negative electric contacts 20, 21. Referring also to FIG. 9, current indicators 60 (e.g. triangular arrow) are arranged between the tandem electric contacts 30, so as to indicate the flow direction of the series current of the board bodies 10D during electrical connection and expansion.

I claim:

1. A light emitting diode (LED) circuit board with multi-directional electrical connectivity, the circuit board comprising:
    a board body, having a surface with a thickness and an assembly plane, said board body being provided with at least four sides and corners between the sides;
    an LED unit provide on said surface; and
    a plurality of positive and negative electric contacts, separately arranged onto the surface of the board body nearby four sides, the positive and negative electric contacts being arranged at intervals, wherein at least one board body is electrically connected by the positive and negative electric contacts and electrically supplied by only connecting the local board body with a power supply.

2. The circuit board defined in claim 1, having a modular pattern connected by a plurality of board bodies and further comprising:
    a precut slit preset between the connected sides of the board bodies, the connected side of the board bodies being breakable and separable.

3. The circuit board defined in claim 2, wherein two connected sides of the board bodies has a notched flange preset between said two connected sides of the board bodies forming a break off and leveling the fracture surface.

4. The circuit board defined in claim 1, wherein positive and negative electric contacts of different board bodies connect by conductor wire for electrical transmission.

5. The circuit board defined in claim 1, further comprising:
    a branching sign arranged onto a surface of the board bodies, positive and negative electric contacts nearby the sides of the board bodies being identifiable by said branching sign and located at power input or output sides.

6. The circuit board defined in claim 5, wherein said branching sign is comprised of a first arrow nearby a corner and the second arrow nearby another corner, two sides being marked nearby the first arrow as power input side and two sides nearby the second arrow as power output side.

7. The circuit board defined in claim 1, further comprising:
    tandem electric contacts arranged on the surface of the board body adjacent to at least two sides, and also at intervals between the positive and negative electric contacts.

8. The circuit board defined in claim 7, wherein current indicators are arranged between the tandem electric contacts, indicating flow direction of the series current.

* * * * *